United States Patent [19]

Shiba et al.

[11] Patent Number: 5,090,360
[45] Date of Patent: Feb. 25, 1992

[54] ATOMIZED THIN FILM FORMING APPARATUS

[75] Inventors: Nobuyasu Shiba; Mizuho Imai; Mikio Sekiguchi; Hideyo Iida, all of Tokyo, Japan

[73] Assignee: Taiyo Yuden Co., Ltd., Tokyo, Japan

[21] Appl. No.: 637,069

[22] Filed: Jan. 3, 1991

[30] Foreign Application Priority Data

Jan. 13, 1990 [JP] Japan .................................. 1-5787

[51] Int. Cl.⁵ .......................... B05B 1/00; B05B 1/34
[52] U.S. Cl. .................................... 118/59; 118/326; 239/589
[58] Field of Search .............. 118/59, 314, 325, 326, 118/428; 239/124, 566, 589 X

[56] References Cited

U.S. PATENT DOCUMENTS

| 121,265 | 11/1871 | Watson | 239/589 |
|---|---|---|---|
| 3,378,396 | 4/1968 | Zaromb | 428/428 |
| 4,783,006 | 11/1988 | Hayashi et al. | 118/300 |
| 4,843,770 | 7/1989 | Crane | 51/439 |

FOREIGN PATENT DOCUMENTS

| 619110 | 9/1935 | Fed. Rep. of Germany . |
| 1496590 | 6/1969 | Fed. Rep. of Germany . |
| 3417229 | 11/1985 | Fed. Rep. of Germany . |

OTHER PUBLICATIONS

Thin Solid Films, vol. 139, No. 2, 5/15/86, pp. 189-199, T. M. Ratcheva et al. "Properties of $In_2O_3$: Te Films Prepared by The Spraying Method".
Solar Energy Materials, vol. 17, No. 6, Oct. 1988, pp. 407-423, Hideyo Iida et al. "Sb-Doped $SnO_2$ Films Deposited by the CMD (Chemical Mist Deposition) Method".

Primary Examiner—Michael Wityshyn
Assistant Examiner—Charles K. Friedman
Attorney, Agent, or Firm—Flynn, Thiel, Boutell & Tanis

[57] ABSTRACT

There is disclosed an atomized thin film forming apparatus for forming a thin film by spouting an atomized source solution toward a heated substrate. A pair of inner wall surfaces defined at the upper portion of a film forming nozzle and disposed opposite to each other with respect to the longitudinal direction of a film forming chamber are restricted so as to gradually narrow in the interval therebetween toward a spouting opening in a smooth curve. Hence, it is possible to prevent a mist of the source solution atomized by the atomizer from being locally stagnant in the film forming nozzle and prevent a precipitate of the atomized source solution from growing. Consequently, the flow of the mist of the source solution is not hindered by the precipitation of the atomized source solution so that the thin film is formed over the surface of the substrate at a high uniformity for a long period of time.

5 Claims, 4 Drawing Sheets

ATOMIZED THIN FILM FORMING APPARATUS

BACKGROUND OF THE INVENTION

1. Field of the Invention

The present invention relates to an atomized thin film forming apparatus for forming a thin film over the surface of a substrate by spraying an atomized source solution over the surface of the heated substrate and, more specifically, to an atomized thin film forming apparatus capable of forming a conductive film over the surface of the heated substrate and preventing the thickness of variation in the conductive film from being large.

2. Prior Art

A transparent conductive film to be employed in a solar cell, liquid crystal display, a plasma display panel, and the like, is formed of a thin film composed of Tin oxide ($SnO_2$) or Indium Tin Oxide (ITO). The transparent conductive film is formed by spouting a mist of an atomized source solution generated by an atomizer toward heated substrates through a film forming nozzle and reacting the atomized source solution on the surface of the heated substrate. An example of a prior art atomized thin film forming apparatus for forming a thin film employed for forming the transparent conductive film according to the method mentioned just above will be described hereinafter. The source solution is atomized by an atomizer and the resultant atomized source solution is spouted from a opening of a film forming nozzle. There is provided a film forming chamber over the spouting opening of the film forming nozzle. The mist of the atomized source solution floats in the film forming chamber. The substrates are delivered successively and continuously into the film forming chamber so that the surfaces of the substrates form a ceiling of the film forming chamber. The substrates are heated to a predetermined temperature by a heater disposed at the rear side of the substrates via a uniform heating plate.

In conventional apparatuses, the substrates such as glass and the like are introduced successively from a substrate inlet of the film forming chamber and delivered into the film forming chamber and discharged from the substrate outlet of the film forming chamber. In the film forming chamber, the film forming nozzle is disposed close to the main surfaces of the substrates at the tip end thereof. The mist of the atomized source solution spouted from the film forming nozzle flows gently toward an exhaust duct of the film forming chamber. While floating toward the exhaust duct, material in the source solution reacts with the oxygen in the air or moisture in the source solution, whereby an oxide accumulates on the surfaces of the substrates to form an oxide film thereon. The mist of the source solution which did not contribute to the formation of the thin film is discharged from the exhaust duct.

The condition of the mist of the source solution when spouted from the film forming nozzle to the film forming chamber is very important factor in effectively forming a film of high uniformity. More in detail, in order to form a film of high uniformity over the surfaces of the substrates, the flow of the mist of the source solution must to be stratified in the film forming chamber. To meet this requirement, it is preferable that the width of the spouting opening of the film forming nozzle from which the mist of the source solution is spouted is, to some extent narrow. However, if the width of the film forming nozzle is restricted as a whole, the resistance of the inner wall surface of the film forming nozzle relative to the flow of the mist of the source solution is increased, thereby reducing the amount of mist of the atomized source solution to be stably supplied in the stratified state per hour. Hence, film forming speed is reduced so that the high productivity can not be obtained. Accordingly, there is proposed a film forming nozzle having an upper end diameter of which is restricted at the appropriate inclination.

However, when the transparent conductive film is formed over the surface of substrates such as glass by conventional film forming apparatus, the uniformity of the thickness of the conductive film is of high just after the start of the formation of the conductive film but as the formation of the film continues, i.e., after the lapse of time, the uniformity of the thickness of the conductive film varies. There appears an interference streak on the conductive thin film having such a variety of thicknesses, it is not necessary properties to obtain the property necessary for the transparent conductive film. This streak is caused be the to restriction of the upper end of the film forming nozzle. That is, due to the restriction of the upper end of the film forming nozzle, there is defined locally a corner portion of the inner wall surface of the film forming nozzle which has an angle which varies precipitously and not gently and the mist of the source solution stagnates on the precipitous corner portion so that the mist of the source generates a precipitate which thereafter grows. Due to the growth of the precipitate, the source solution is prevented from flowing locally.

To overcome the problem set forth above, it is necessary to clean the inner wall of the film forming nozzle or exchange the film forming nozzle with another nozzle before the precipitate of the atomized source solution affects the uniformity of the thickness of the thin film. However, there was a problem in that it was necessary to stop the film forming apparatus each time when the film forming nozzle is cleaned or the film forming nozzle is exchanged with another nozzle, which reduces the working rate of the apparatus and prevents high productivity.

SUMMARY OF THE INVENTION

It is therefore an object of the present invention to provide an atomized thin film forming apparatus capable of overcoming the problems set forth above.

To achieve an object of the present inventon, the atomized thin film forming apparatus according to the present invention comprises an atomizer for atomizing a source solution for forming a thin film, a film forming chamber, a film forming nozzle having a spouting opening directed upwardly and opening into the film forming chamber for spouting the atomized source solution, substrates to be fed in one direction over the spouting opening of the film forming nozzle in the film forming chamber in such a manner so as to form the ceiling of the film forming chamber and heating means for heating the substrates from the rear side thereof in the film forming chamber. The invention is characterized in that a pair of inner wall surfaces defined at the upper end of the film forming nozzle and disposed opposite to each other in the longitudinal direction of the film forming chamber are restricted in the distance therebetween so as to be gradually narrow in the direction from the atomizer toward the spouting opening in a smooth curve.

In other words, the sign of a first differential coefficient, i.e., the differential coefficient obtained by first differentiating the horizontal displacement of the inner wall surfaces of the film forming nozzle by a perpendicular displacement thereof is constant.

In the atomized thin film forming apparatus according to the present invention, inasmuch as the inner wall surfaces of the film forming nozzle at the upper end thereof is restricted by forming the gentle curve, the mist of the atomized source solution is not locally stagnant and the precipitate is not generated at the specific portion. Accordingly, there is no likelihood that a thin film formed over the surfaces of the substrates becomes uneven in the thickness thereof since the mist of the source solution is prevented from flowing locally by the precipitation of the atomized source solution, thereby the thickness of the thin film from is even over the entire surface of the substrate which enables the formation of a thin film having high uniformity over the entire surface of the substrate. As a result, it is possible to eliminate the frequent cleaning of the film forming nozzle and effectively form a thin film of high quality.

The above and other objects, features and advantages of the present invention will become more apparent from the following description taken in conjunction with the accompanying drawings.

DESCRIPTION OF THE PREFERRED EMBODIMENT (FIGS. 1 to 4 and FIG. 6(a) and (b))

An atomized thin film forming apparatus according to a preferred embodiment will be described with reference to FIGS. 1 to 4 and FIGS. 6(a) and (b).

Figure 1:
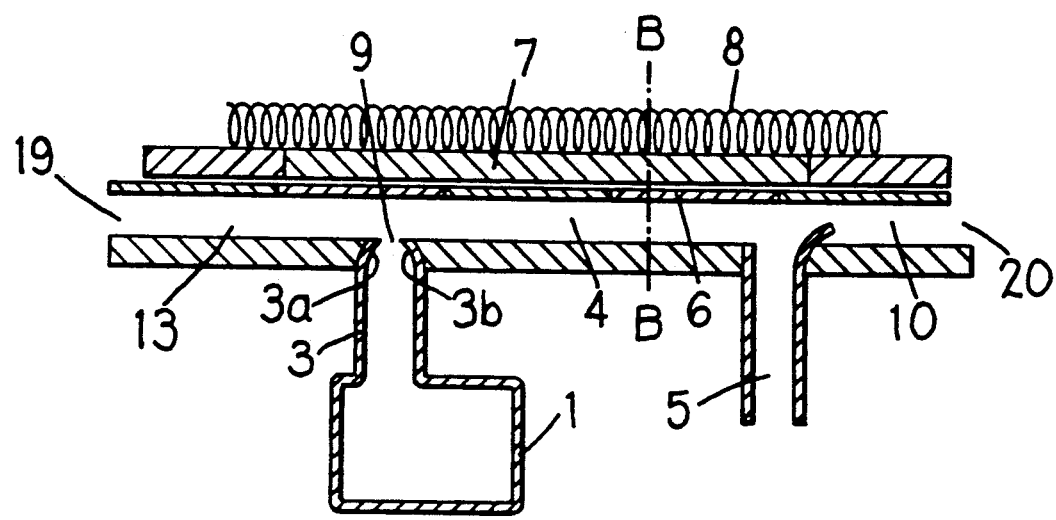
FIG. 1 is a schematic longitudinal cross sectional side view showing an atomized thin film forming apparatus according to a preferred embodiment of the present invention.
Figure 4:
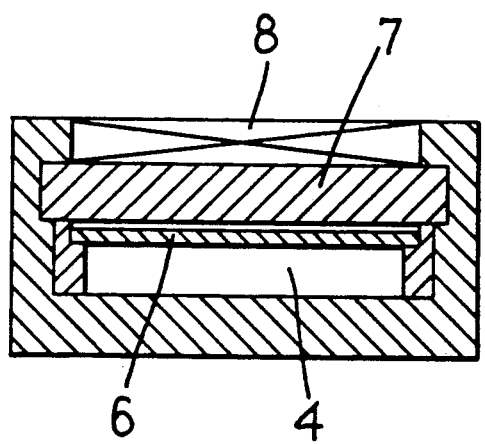
FIG. 4 is a longitudinal cross sectional front view taken along B—B of FIG. 1.

As illustrated in FIGS. 1 and 4, substrates 6, such as glass and the like, are delivered from left to right in FIG. 1 while they are held at both sides thereof. A tunnel-shaped preliminary heating chamber 13, a film forming chamber 4 and a substrate delivery chamber 10, each having a ceiling formed by a substrate 6 and surrounded by frames 11 and 12 at side surfaces and a bottom surface thereof, are successively in turn formed in a delivery route of the substrate 6 extending from a substrate inlet 19 to a substrate outlet 20.

There are provided an atomizer 1 for atomizing a source solution for forming a thin film and a film forming nozzle 3 extending from and over the atomizer 1. The film forming chamber 4 is disposed over the film forming nozzle 3. The film forming nozzle 3 has a spouting opening 9 opening upwardly and into the film forming chamber 4 for spouting the mist of the source solution atomized by the atomizer 1 into the film forming chamber 4. There is provided an exhaust duct 5 near the substrate delivery chamber 10 for exhausting a mist of the atomized source solution which did not contribute to the formation of the thin film over the surface of the substrate 6.

There are provided a uniform heating plate 7 having a high thermal conductivity over the substrates 6 which are fed into the preliminary heating chamber 13, the film forming chamber 4 and the substrate delivery chamber 10. A heater 8 is provided at the rear side of the uniform heating plate 7. When the heater 8 generates heat, the substrates 6 are heated via the uniform heating plate 7.

In the atomized thin film forming apparatus according to the present invention, the pair of inner wall surfaces 3a, 3b defined at the upper portion of the film forming nozzle 3 and disposed opposite to each other along the longitudinal direction of the film forming chamber 4 are restricted so as to gradually narrow from the side of the atomizer 1 toward the spouting opening 9 in the interval therebetween in a smooth curve. More specifically, the coefficient of the first differential, i.e., a derivative obtained by differentiating the horizontal displacement of the inner wall surfaces of the film forming nozzle by the perpendicular displacement thereof is constant in any portion of the inner wall surfaces.

For example, the inner wall surfaces 3a and 3b of the film forming nozzle 3 are restricted so as to be smoothly narrowed for preventing the inner wall surfaces 3a and 3b from generating locally a precipitous angle or inclination. FIG. 3(a) is a cross section taken along A—A of FIG. 2 in which a pair of inner wall surfaces 3c and 3d defined at the upper portion of the film forming nozzle and confronting with each other in the width direction of the film forming chamber are similarly curved smoothly.

Inasmuch as the inner wall surfaces 3a, 3b of the film forming nozzle 3 are restricted to form a smooth curve along the vertical direction, the whirlpool of the mist of the atomized source solution is hardly generated whereby the mist is stratified in the film forming nozzle 3 and rises upward and is discharged from the spouting opening 9 into the film forming chamber 4.

Figure 3A:
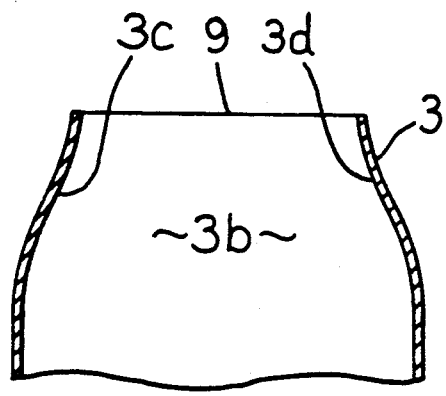
FIGS. 3(a) and (b) are views of assistance in explaining cross sections taken along A—A of FIG. 2.
Figure 3B:
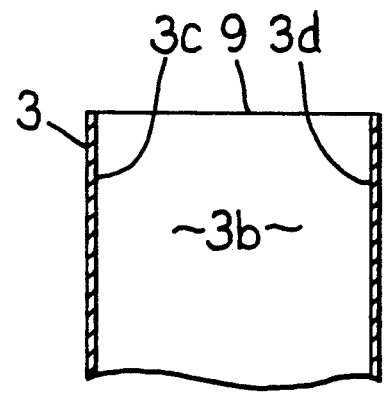

FIG. 3(b) shows a cross section of the film forming nozzle 3 similar to FIG. 3(a) in which the inner wall surfaces 3a, 3b of the film forming nozzle 3 are not restricted at the upper portion thereof but are erect instead. The distance between inner wall surfaces 3c, 3d of the spouting opening 9 of the film forming nozzle 3 in FIG. 3(b) has a sufficient width since the distance must be greater than the width of the substrate 6. Accordingly, it is not always necessary to restrict the upper portion of the film forming nozzle but the inner wall surfaces 3c and 3d are preferred to be erect so that the mist of the source solution smoothly rises therefrom.

In the atomized thin film forming apparatus provided with the film forming nozzle 3 having a cross section at the upper portion thereof as illustrated in FIG. 1, FIG.

Figure 6A:
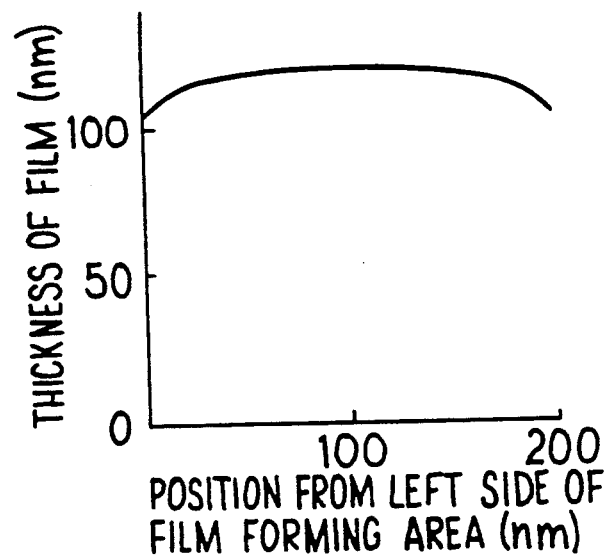
FIGS. 6(a) and 6(b) are graphs showing the distribution of the thickness of the film in the lateral direction of the substrate formed over the surface of the substrate just after the start of formation and that over the 1001th substrate according to the present atomized thin film forming apparatus.
Figure 6B:
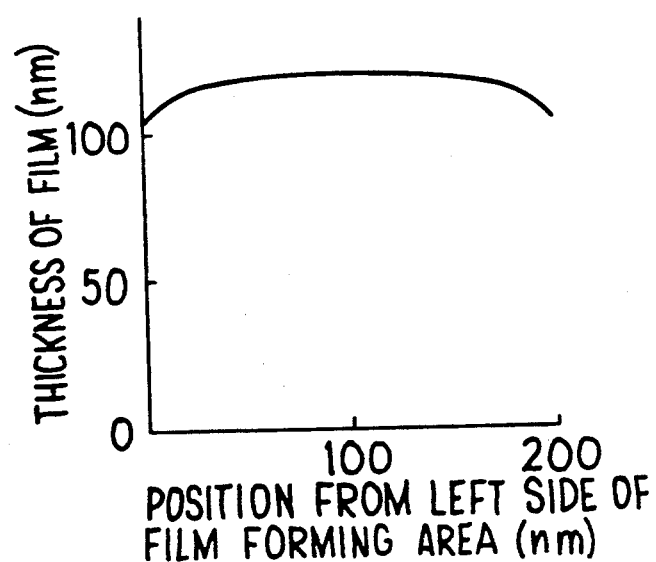

2 and FIG. 3(b), a Tin oxide film, as the transparent conductive film, is formed over the surface of the glass substrate 6 and the variation in thickness in the width direction of the substrate 6 is measured. The resultant measurement is illustrated in FIGS. 6(a) and (b). FIG. 6(a) shows the film thickness distribution of the Tin oxide film just after the start of formation of the film and FIG. 6(b) shows the film thickness distribution of the Tin oxide film formed over the 1001th substrate 6. The film distribution is measured for the film forming area of the width of the film except for the side portions of the substrate 6 which are held by the substrate feeding means and to which no mist is sprayed. The width a =200 mm. The source solution was a mixed solution of 15 mol % SnCl$_4$, 20 mol % NH$_4$F and 5 mol % Alcohol. The source solution was atomized at an atomizing rate of 1 l/hr, and the mist of the source solution was supplied through the nozzle 3 to the film forming chamber 4 together with air which was supplied at a rate of 100 l/min. The substrate 6 was passed through the film forming chamber 4 in three minutes.

Figure 5A:
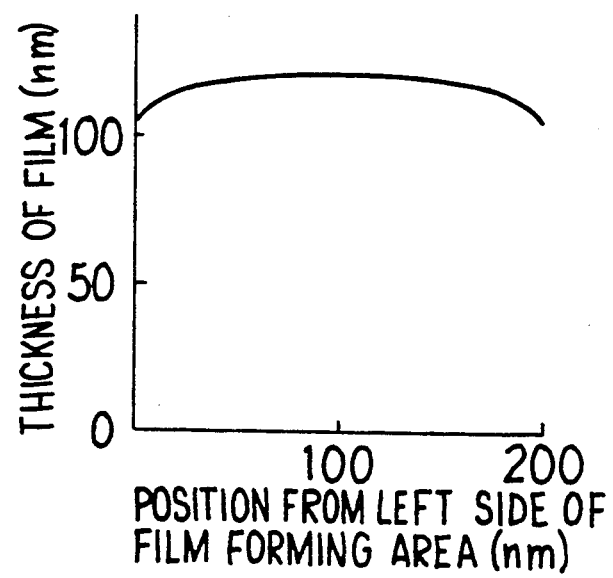
FIGS. 5(a) and 5(b) are graphs showing the distribution of the thickness of the film in the lateral direction of the substrate formed over the surface of the substrate just after the start of formation and that over the 1001th substrate according to the conventional atomized thin film forming apparatus.
Figure 5B:
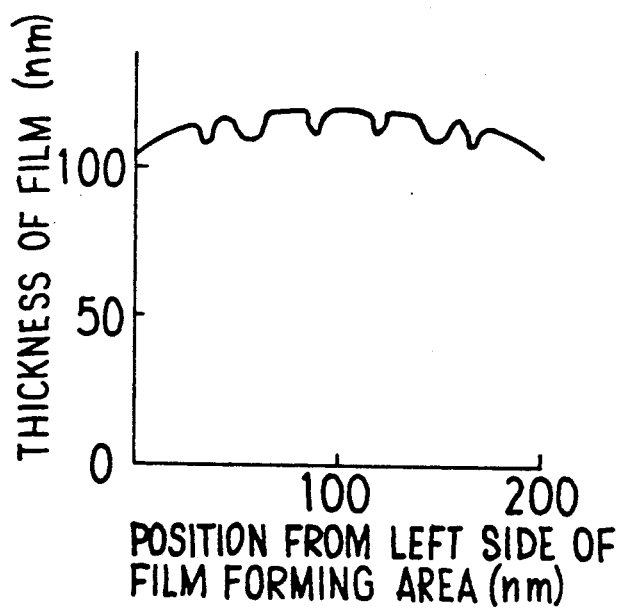

As a comparison, a transparent conductive film was is formed under the same condition as described just above with use of a conventional atomized thin film forming apparatus provided with a film forming nozzle and the resultant film is measured and the thickness distribution of the film in the width direction of the substrate is illustrated in FIG. 5(a) and (b). FIG. 5(a) shows a film thickness distribution of the Tin oxide film just after the start of formation of the film and FIG. 5(b) shows a film thickness distribution of the Tin oxide film formed over the 1001th substrate 6.

Figure 2:
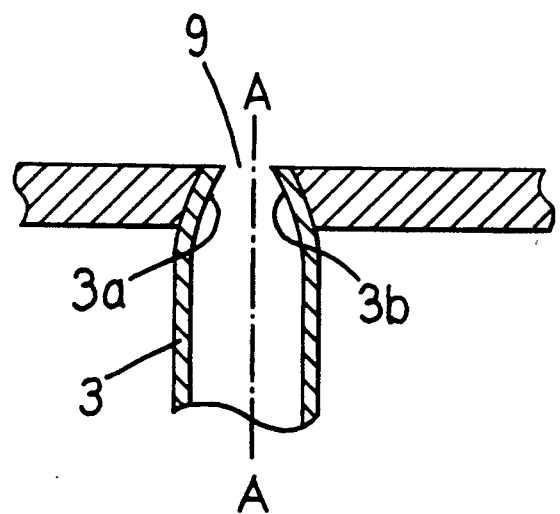
FIG. 2 is an enlarged longitudinal cross sectional side view of a main portion of the upper end of a film forming nozzle of the atomized thin film forming apparatus of FIG. 1.

From the resultant measurement, in the atomized thin film forming apparatus provided with the film forming nozzle 3 having the cross section at the upper portion thereof as illustrated in FIG. 1, FIG. 2 and FIG. 3(b), the thickness of the Tin oxide film formed over the surface of the first substrate 6 is the same as the one formed over the 1001st substrate in the width direction of the substrates. On the other hand, in the conventional thin film forming apparatus, although the thickness of the film formed over the surface of the first substrate 6 is substantially the same in its entirely, the thickness of the film formed over the surface of the 1001th substrate 6 is varied in the width direction of the substrate 6.

In to the conventional atomized thin film forming apparatus, the mist of the source solution is locally stagnant at the corner portion having a precipitous angle at the inner wall surfaces confronting each other at the upper portion of the film forming nozzle and the precipitation of the atomized source solution grows on the portion of the nozzle where the atomized source solution is stagnant whereby the mist is prevented from smoothly flowing therefrom. Consequently, it seems that the thickness of the thin film is liable to vary.

Whereupon, according to the present invention, the inner wall surfaces 3a, 3b of the upper portion of the film forming nozzle 3 are restricted in smooth curve so that the local stagnation of the source solution is not likely to occur, hence the precipitation of the atomized source solution is not likely to grow. As a result, the thickness of the thin film formed over the surface of the substrate 6 is uniform.

Although the invention has been described in its preferred form with a certain degree of particularity, it is to be understood that many variations and changes are possible in the invention without departing from the scope thereof.

What is claimed is:

1. A thin film forming apparatus for forming a thin film on a plurality of substrates, said apparatus comprising:

an atomizer for atomizing a source solution;
a film forming chamber provided above said atomizer;
a nozzle provided on an upper portion of said atomizer and connected to and opening into said film forming chamber so as to be able to introduce atomized source solution therein, said nozzle having an upper portion comprising a pair of inner wall surfaces which are disposed opposite to each other with respect to the longitudinal direction of the film forming chamber, said inner wall surfaces being concavely curved toward each other so as to gradually decrease the distance therebetween as the inner wall surfaces approach the nozzle opening, the rate of decrease in the distance between said inner wall surfaces gradually increasing as said inner wall surfaces approach the nozzle opening;
substrate feeding means for feeding said substrates into said film forming chamber in such a manner that said substrates form the ceiling in said film forming chamber; and
heating means for heating said substrates.

2. A thin film forming apparatus according to claim 1, wherein the inner wall surfaces are concavely curved in such a manner that a differential coefficient obtained by differentiating the horizontal displacement thereof with respect to the vertical displacement is constant.

3. A thin film forming apparatus according to claim 1, wherein said nozzle comprises another pair of inner wall surfaces, said another pair of inner wall surfaces being provided opposite to each other with respect to the lateral direction of said film forming chamber and having straight surfaces.

4. A thin film forming apparatus according to claim 1, wherein said nozzle comprises another pair of inner wall surfaces, said another pair of inner wall surfaces being disposed opposite to each other with respect to the lateral direction of said film forming chamber and concavely curved toward each other so as to gradually decrease the distance therebetween as said another pair of inner wall surfaces approach the nozzle opening.

5. A thin film forming apparatus according to claim 1, wherein said nozzle opening is longer and narrower in the lateral direction of the film forming chamber.

* * * * *